United States Patent
Ahner et al.

(10) Patent No.: US 9,984,751 B1
(45) Date of Patent: *May 29, 2018

(54) THREE DIMENSIONAL OPTICAL MEMORY DEVICE

(71) Applicant: Seagate Technology LLC, Cupertino, CA (US)

(72) Inventors: Joachim Ahner, Livermore, CA (US); David Marcus Tung, Livermore, CA (US)

(73) Assignee: Seagate Technology LLC, Cupertino, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/415,599

(22) Filed: Jan. 25, 2017

Related U.S. Application Data

(63) Continuation-in-part of application No. 15/345,389, filed on Nov. 7, 2016, now Pat. No. 9,792,945.

(51) Int. Cl.
  *G11C 13/04* (2006.01)

(52) U.S. Cl.
  CPC .......... *G11C 13/047* (2013.01); *G11C 13/048* (2013.01)

(58) Field of Classification Search
  CPC ... G11C 13/047; G11C 13/048; G11C 13/041; G11B 2007/0009; G11B 11/002; G11B 7/1275
  See application file for complete search history.

(56) References Cited

U.S. PATENT DOCUMENTS

| | | | |
|---|---|---|---|
| 4,471,470 A | 9/1984 | Swainson et al. | |
| 5,253,198 A | 10/1993 | Birge et al. | |
| 5,325,324 A * | 6/1994 | Rentzepis | B82Y 10/00 365/106 |
| 6,005,817 A * | 12/1999 | Gudesen | G11C 7/005 365/106 |
| 6,590,852 B1 * | 7/2003 | McCormick, Jr. | B82Y 10/00 369/112.23 |
| 6,970,414 B1 | 11/2005 | Pavel | |
| 2007/0047287 A1 | 3/2007 | Hell et al. | |
| 2011/0019511 A1 | 1/2011 | Fort et al. | |
| 2012/0147724 A1 * | 6/2012 | Natarajan | B82Y 10/00 369/103 |

* cited by examiner

Primary Examiner — Ajay Ojha

(57) ABSTRACT

A system includes a data storage medium comprising layers, an excitation circuit, and an emitter. Each layer comprises cells arranged in a horizontal plane. Cells in different layers are arranged in a vertical plane of the data storage medium. The excitation circuit excites a layer during excitation period. Exciting the layer changes an optical property of the layer during the excitation period. The emitter emits a first and a second beam onto a first and a second cell of the layer being excited during the excitation period to orient electrical charges within the first and the second cell to a first and second oriented values and their intensity to a first and second intensity values respectively. The first and second cells maintain the first and second oriented values and the first and second intensity values after the excitation period is over or in absence of the layer being excited.

24 Claims, 16 Drawing Sheets

THREE DIMENSIONAL OPTICAL MEMORY DEVICE

RELATED APPLICATIONS

This application is a continuation in part and claims the benefit and priority to a U.S. patent application Ser. No. 15/345,389, filed on Nov. 7, 2016, which is incorporated by reference herein.

BACKGROUND

Certain devices use disk drives with perpendicular magnetic recording media to store information. For example, disk drives can be found in many desktop computers, laptop computers, and data centers. Perpendicular magnetic recording media store information magnetically as bits. Bits store information by holding and maintaining a magnetization that is adjusted by a disk drive head. In order to store more information on a disk, bits are made smaller and packed closer together, thereby increasing the density of the bits. Therefore as the bit density increases, disk drives can store more information. However as bits become smaller and are packed closer together, the bits become increasingly susceptible to erasure, for example due to thermally activated magnetization reversal or adjacent track interference.

SUMMARY

Provided herein is an apparatus including a first storage cell with an electrical property. A system includes a data storage medium, an excitation circuit, and an emitter. The data storage medium includes a plurality of layers. Each layer comprises a plurality of cells that are arranged in a horizontal plane of the data storage medium with respect to one another. Cells in different layers of the plurality of layers are arranged in a vertical plane of the data storage medium with respect to one another. The excitation circuit is configured to excite a layer of the plurality of layers during excitation period. Exciting the layer of the plurality of layers changes an optical property of the layer during the excitation period. The emitter is configured to emit a first beam onto a first cell of the layer being excited during the excitation period to orient electrical charges within the first cell to a first oriented value and their intensity to a first intensity value. The emitter is further configured to emit a second beam onto a second cell of the layer being excited during the excitation period to orient electrical charges within the second cell to a second oriented value and their intensity to a second intensity value. The first cell maintains the first oriented value and the first intensity value after the excitation period is over or in absence of the layer being excited. The second cell maintains the second oriented value and the second intensity value after the excitation period is over or in absence of the layer being excited. These and other features and advantages will be apparent from a reading of the following detailed description.

DESCRIPTION

Figure 1:
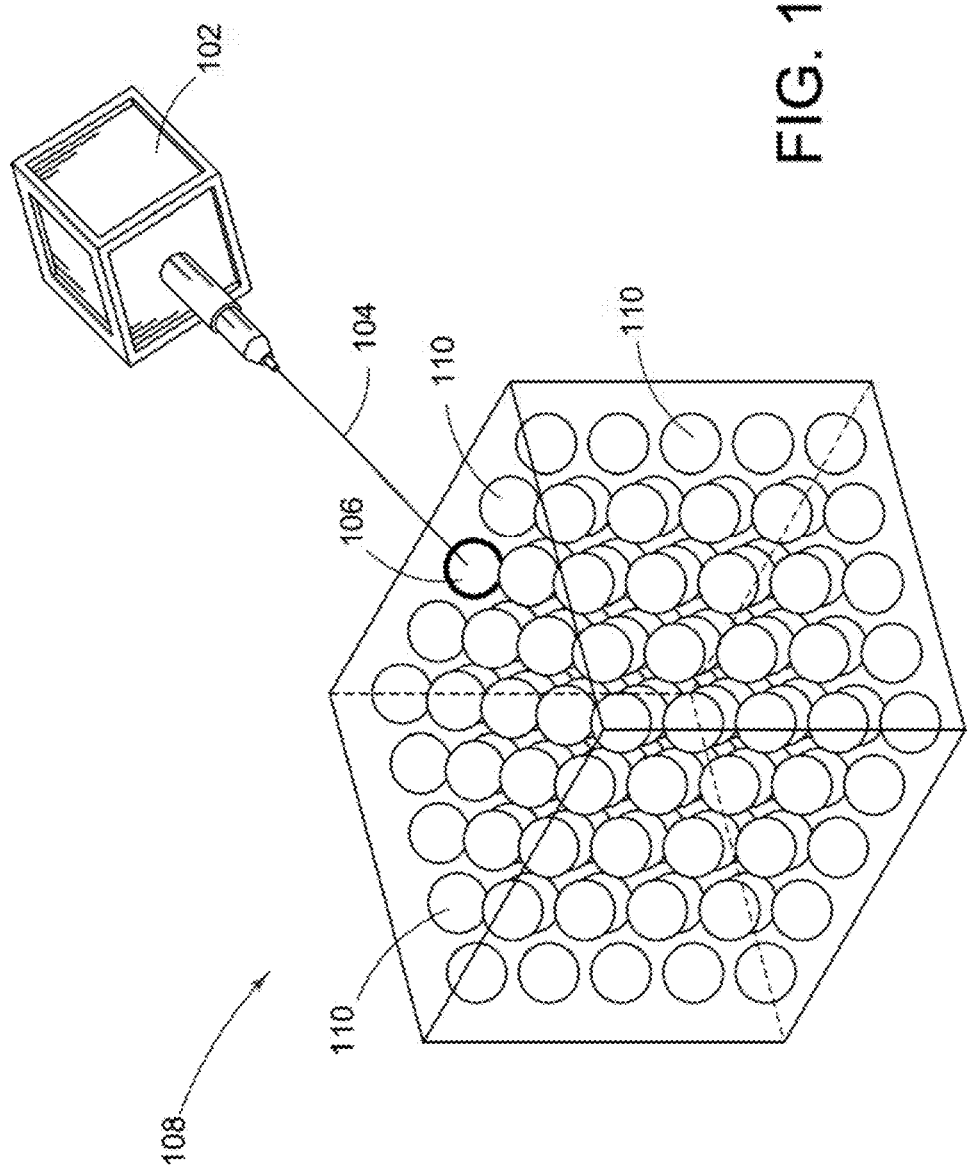
FIG. 1 shows an emitter focusing a laser on a target cell of a three dimensional storage device according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

As the technology of magnetic recording media reaches maturity, it becomes increasingly difficult to continue to increase the storage capacity of recording media (e.g. disk drive disks) or to reduce the size of recording media while maintaining storage capacity. Such challenges may be overcome by increasing the bit density on the recording media. However, increasing the bit density is not always possible. For example, increasing bit density can decrease the signal to noise ratio ("SNR") below acceptable levels. Furthermore, reducing the bit size or the thickness of the stack lowers the thermal stability of the grains within the bits, thereby increasing the grains' susceptibility to fluctuation and information loss.

Embodiments described below address these concerns with information storage cells arranged in a three dimensional structure where information is stored electrically with the use of one or more lasers. For example, in various embodiments a higher power write laser is used to write information to a storage cell by electrically changing electric field orientations and intensities of the storage cell. A lower power read laser is used to read the stored information from the storage cell, without altering the electric field orientations and intensities (e.g. changing the stored information) of the storage cell. The read/write lasers may be focused at any depth and location within the three dimensional structure, without being interfered with or interfering with other storage cells.

Referring now to FIG. 1, an emitter 102 focusing a laser 104 on a target cell 106 of a three dimensional storage device 108 are shown according to one aspect of the present embodiments. The emitter 102 may be for example a femtosecond laser that emits light energy as the laser 104. The laser 104 is focused on the target cell 106. The target cell 106 is one of many storage cells 110 arranged within a three dimensional array within the three dimensional storage device 108. When the laser 104 is focused on the target cell 106, properties of the target cell 106 are altered, thereby storing information. For example, the laser 104 may change properties of the target cell 106 including electric field orientations and intensities. Therefore, as a result of altering the properties, information may be written to the cells.

The emitter 102 is configured to alter the electric field orientations and intensities of the target cell 106 by focusing the laser 104 directly on the target cell 106. As such, the laser 104 does not affect other storage cells 110 until the laser 104 is focused on another storage cell. The laser 104 may be focused at any location and depth within the three dimensional storage device 108. For example, the emitter 102 may focus the laser 104 at a location directly in the middle of the three dimensional storage device 108. As a result, the laser 104 will pass through many of the storage cells 110, without affecting their electrical characteristics (e.g. electric field orientations and intensities). However, the storage cell directly in the middle that the laser 104 is focused upon will have its electrical characteristics changed as a result of the focused laser 104. In various embodiments, the storage cells 110 retain their electrical characteristics after the writing process performed by the emitter 102 and the laser 104.

It is understood that in various embodiments the illustrated storage cells 110 are figurative representations of locations within the three dimensional storage device 108. Therefore, in some embodiments two similarly shaped and sized three dimensional storage devices may have different densities and/or patterns of storage cells as a result of varying the focused locations of the laser 104.

In various embodiments, the three dimensional storage device 108 is a transparent or semi-transparent material. For example, the three dimensional storage device 108 may include quartz, diamond, aluminum oxide, or other transparent/semi-transparent materials. In some embodiments, the laser 104 may create little to no heat within the three-dimensional storage device 108. It is understood that heat may be prevented, for example, by selecting an emitter 102 which produces a laser 104 that does not cause the molecules of the three dimensional storage device 108 to vibrate in a heat producing fashion. For example, a femtosecond laser may be focused on the target cell 106, without heating the target cell 106, other storage cells 110, and other areas of the three dimensional storage device 108. Such examples for preventing or limiting heat are merely exemplary and are understood to be non-limiting.

Figure 2:
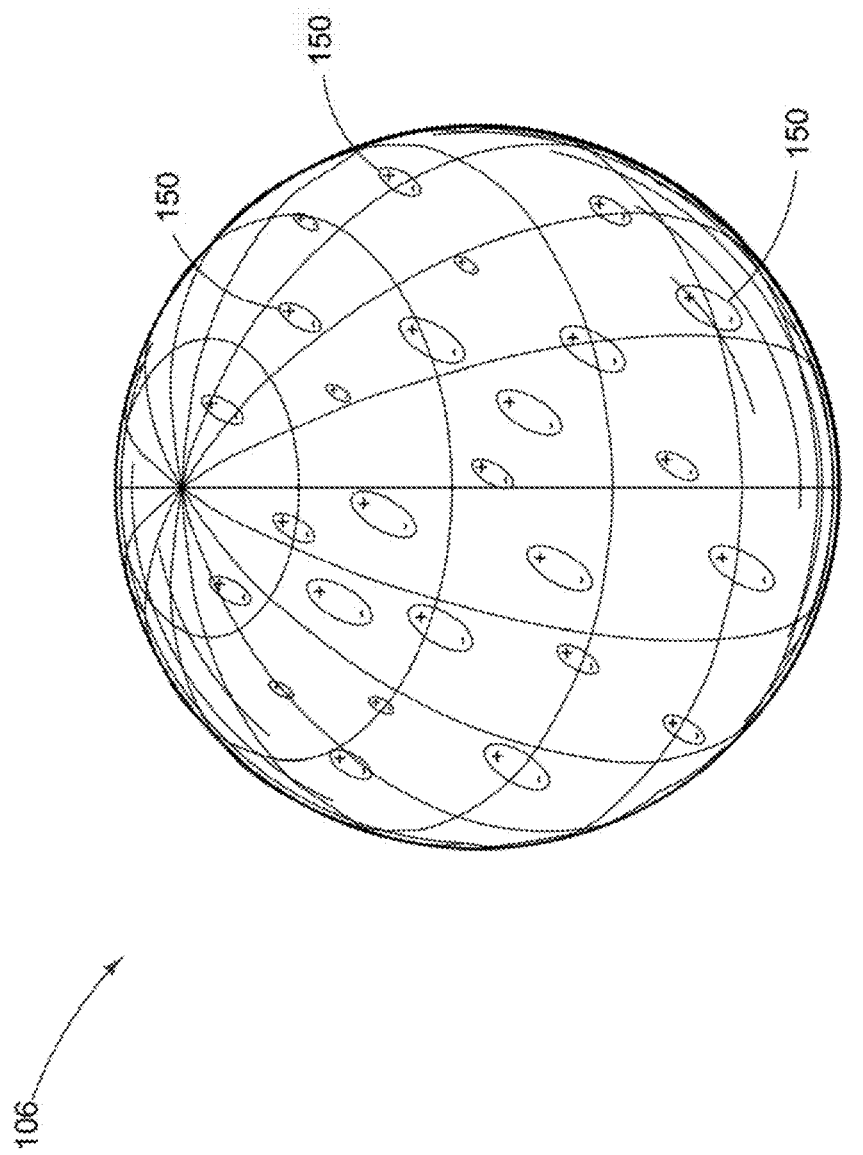
FIG. 2 shows an enlarged view of the target cell including figurative representations of dipole orientations according to one aspect of the present embodiments.

Referring now to FIG. 2, an enlarged view of the target cell 106 including figurative representations of dipole orientations 150 is sown according to one aspect of the present embodiments. In some embodiments, the laser 104 (see FIG. 1) causes mobility within the target cell 106 such that the dipole orientations 150 within the target cell 106 align with the excitation laser. In other embodiments, a separate orientation laser may be used to cause alignment of the dipole orientations 150. The dipole orientations 150 may be aligned in any direction. For example, in the illustrated embodiment the dipole orientations 150 may be identified according to a spherical coordinate system. However, alternate embodiments may use coordinate systems and alignments according to any shape. As a result of the dipole orientations 150, the target cell 106 may store information according to both the target cell's location within the three dimensional storage device, as well as the target cell's dipole orientation.

Figure 3:
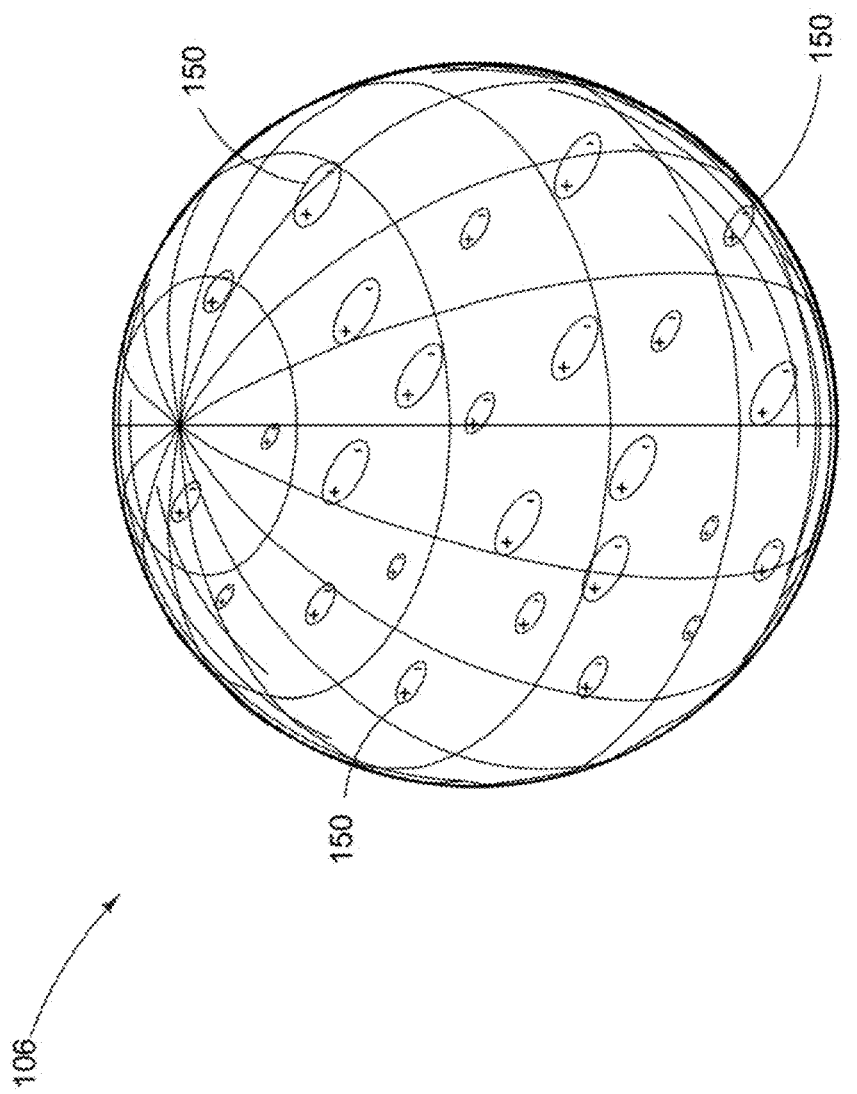
FIG. 3 shows an enlarged view of the target cell including changes to the figurative representations of the dipole orientations according to one aspect of the present embodiments.

Referring now to FIG. 3, an enlarged view of the target cell 106 including changes to the figurative representations of the dipole orientations 150 is shown according to one aspect of the present embodiments. As described above, dipole orientations 150 may be aligned and realigned over and over again. For example, one or more lasers may cause mobility of the dipole orientations 150 allowing for alignment/realignment of the dipole orientations 150 in order to store information. Furthermore, different laser characteristics may be used to alter the dipole orientations 150 in predetermined fashions. For example, a first light energy may change the dipole orientations 150 (e.g. electrical properties) in a first desired way. A second light energy that is different from the first light energy (e.g. different intensity, wavelength, etc.) may alter the previous change to the dipole orientations 150 in a second desired way. As a result, the target cell 106 (e.g. information storage cell) may be repeatedly written and rewritten according to variations in the light energy.

It is understood that in various embodiments not all of the dipole orientations 150 will share the same alignment, and it is not necessary for all of the dipole orientations 150 to share the same alignment. In such embodiments, information can be stored by orienting enough of the dipole orientations 150 for an alignment to be determined. Indeed, in other embodiments more than one alignment can be shared by different groups within the target cell 106, as long as the different alignments are detectable enough to retrieve stored information.

Figure 4:
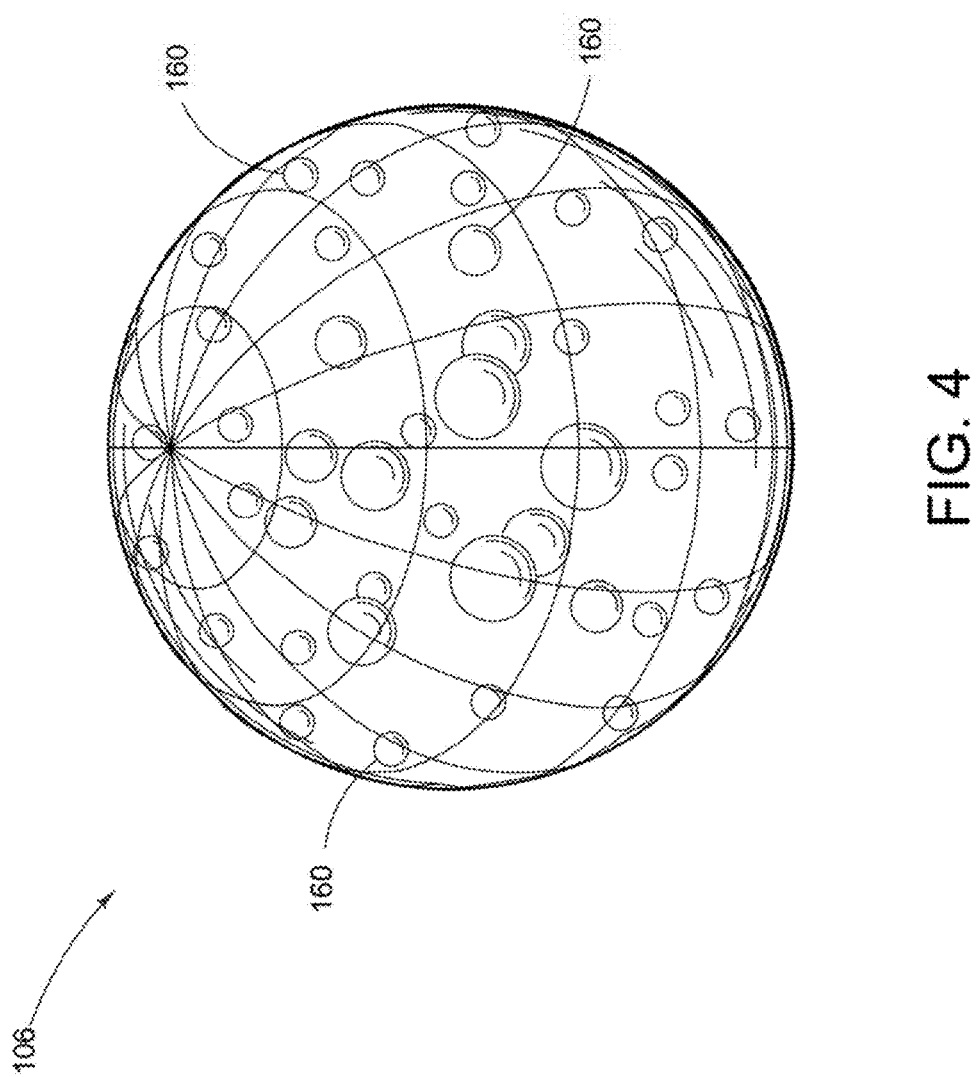
FIG. 4 shows an enlarged view of the target cell including figurative representations of free electrons according to one aspect of the present embodiments.

Referring now to FIG. 4, an enlarged view of the target cell 106 including figurative representations of free electrons 160 is shown according to one aspect of the present embodiments. As previously described, in various embodiments an excitation laser may excite electrons thereby creating free charge. For example, a laser may cause a coulomb explosion thereby exciting the free electrons 106 and creating charge mobility within the target cell 106. The same laser or a different laser may then be used (or simultaneously used) to control the free electrons 106 within the target cell 106. As a result, in some embodiments the characteristics of the target cell 106 are altered to store information electrically by redistributing the free electrons 106 to align with the incoming light's electric field (e.g. the electric field of the laser 104, see FIG. 1). As such, the light's electric field intensity is sufficiently high such that the ensemble of electron's potential energy is increased so that charge mobility in the target cell can occur.

Figure 5:
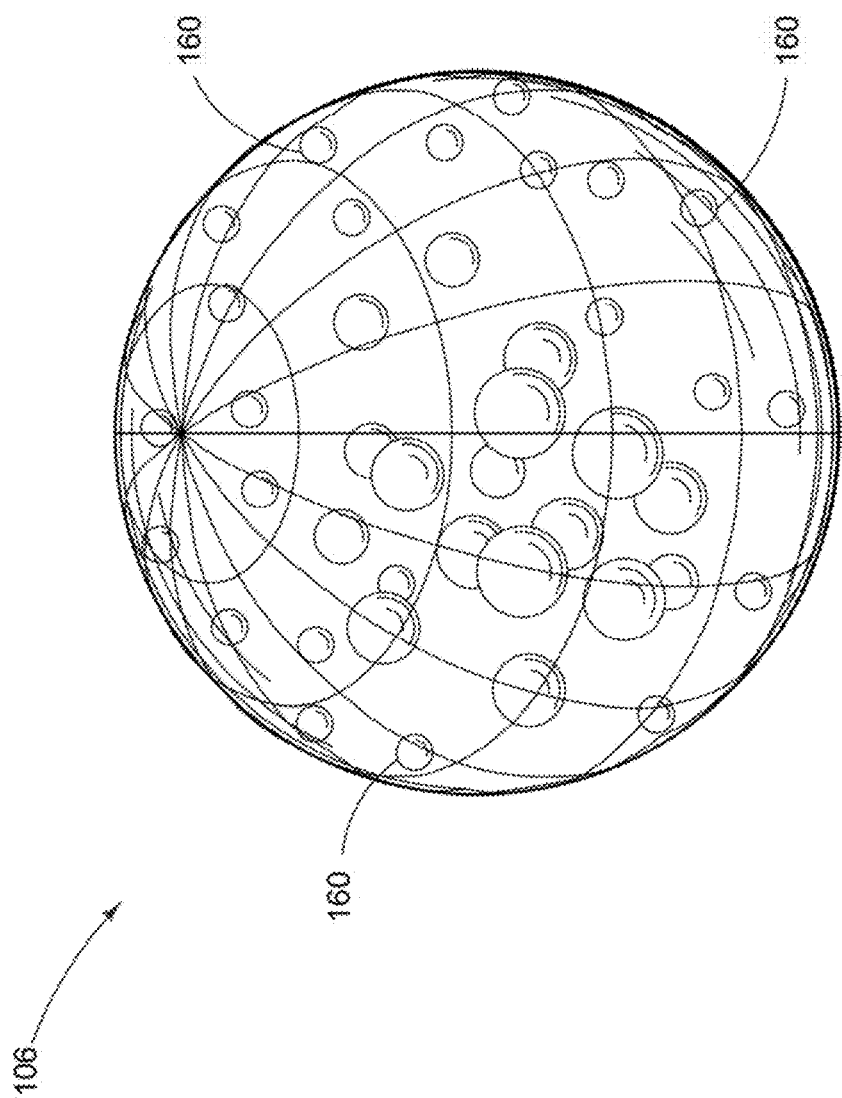
FIG. 5 shows an enlarged view of the target cell including a first increased density of free electrons according to one aspect of the present embodiments.

Referring now to FIG. 5, an enlarged view of the target cell 106 including a first increased density of free electrons 160 is shown according to one aspect of the present embodiments. In various embodiments, the excited free electrons 106 (e.g. free charge) accumulate at a location in the target cell 106 based on the electric field intensity of one or more lasers (e.g. laser 104, see FIG. 1). As a result, information can be stored by detecting the location of the accumulated electrical charge within the target cell 106. In the illustrated embodiment, the location of the increased density of the free electrons 160 may be expressed according to a spherical coordinate system. However, alternate embodiments may use target cells and coordinate systems according to any shape.

Figure 6:
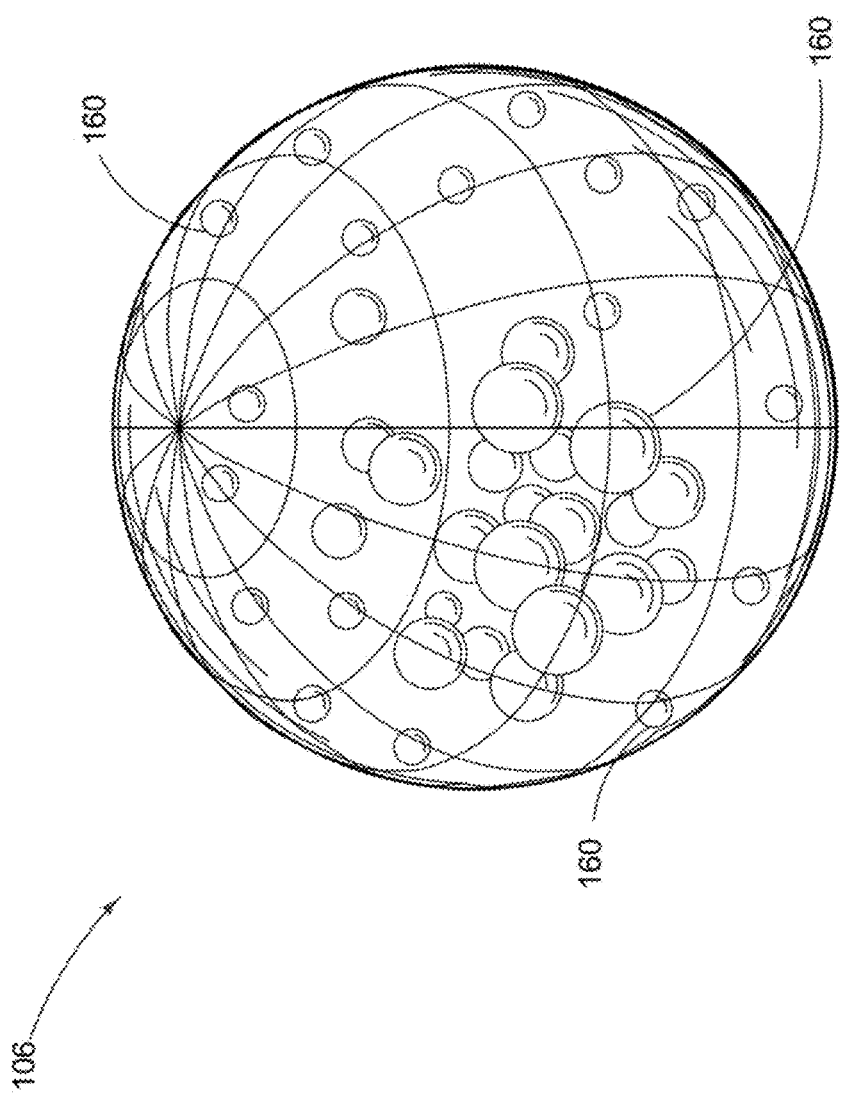
FIG. 6 shows an enlarged view of the target cell including a second increased density of free electrons according to one aspect of the present embodiments.

Referring now to FIG. 6, an enlarged view of the target cell 106 including a second increased density of free electrons 160 is shown according to one aspect of the present embodiments. In some embodiments, the density of the free electrons 160 is controlled and detectable. As such, the magnitude and intensity of the stored charge can also be used to store information along with the location of the charge. For example, the first density of free electrons illustrated in FIG. 5 will have a weaker intensity than the second increased density of free electrons 160 illustrated in FIG. 6, because the second increased density is greater than the first increased intensity. In further embodiments, different densities of the free electrons 160 may be used to create varying intensities of electrical charge, thereby allowing for the storage of different information within the target cell 106. In other embodiments, more than one density of free electrons 160 with different intensities can be stored within the target cell 106, as long as the more than one densities and intensities of the free electrons 160 are detectable enough to retrieve stored information.

Figure 7:
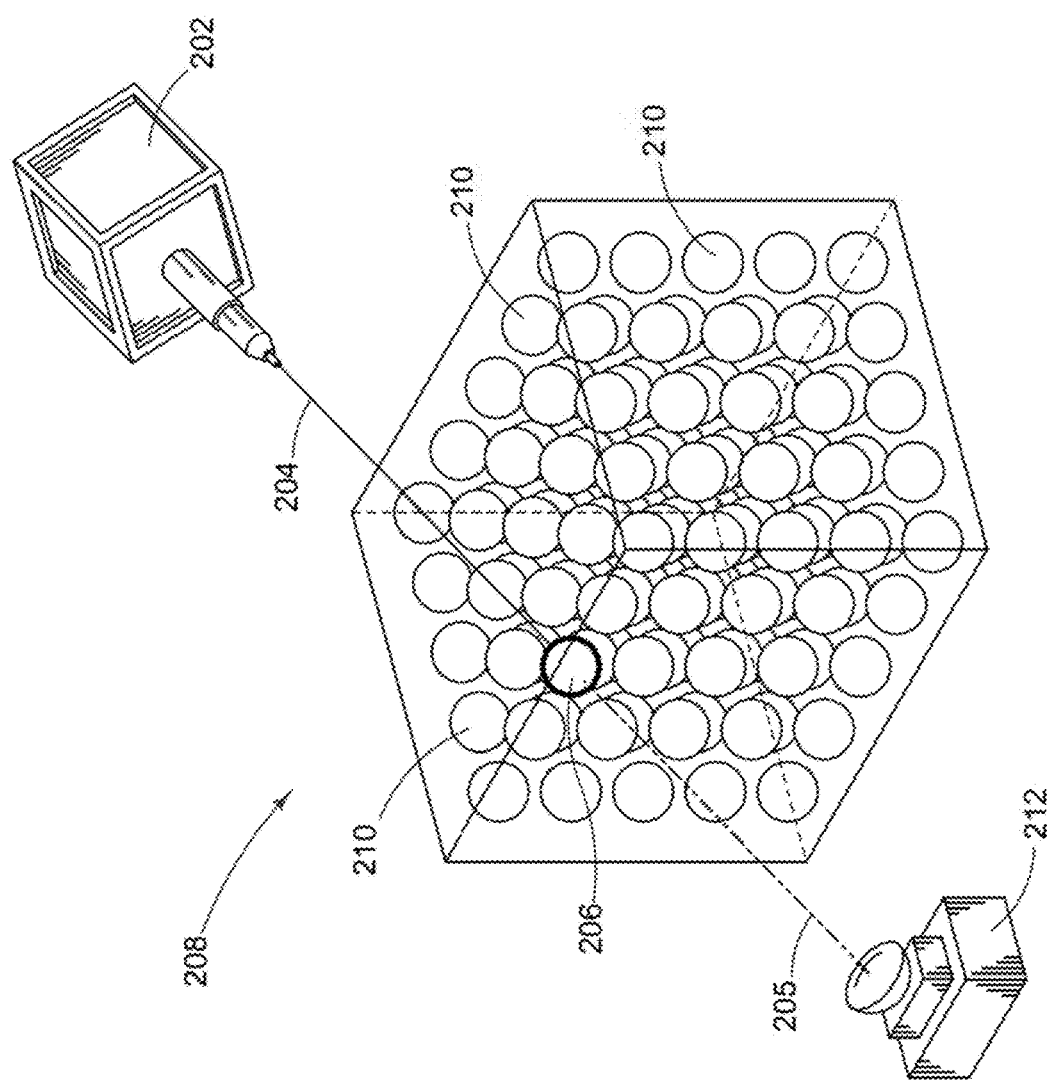
FIG. 7 shows a target cell of a three dimensional storage device altering a laser from an emitter, and a detector detecting the altered laser according to one aspect of the present embodiments.

Referring now to FIG. 7, a target cell 206 of a three dimensional storage device 208 altering a laser 204 from an emitter 202, and a detector 212 detecting the altered laser 205 is shown according to one aspect of the present embodiments. The emitter 202 generates a lower power laser 204 than the FIG. 1 laser 104. As such, the lower power laser 204 may be focused on the target cell 206, without altering the properties of the target cell 206. However, the properties of the target cell 206 may alter the laser 204, thereby transforming the laser 204 into the altered laser 205. The altered laser 205 is then detected at the detector 212. As a result, information stored by the target cell 206 may be read through the detection of the altered laser 205. It is understood that in certain configurations the target cell 206 may not alter the properties of the laser 204, and therefore the altered laser 205 may be the same as the laser 204.

For example, information may be electrically stored in one or more of the cells, as described in FIGS. 1-6. The emitter 202 may then generate the laser 204 with a first property (for example a first wavelength). The laser 204 is focused on the target cell 206, and travels through other storage cells 210, without being altered. The target cell 206 then changes the first property of the laser 204 into a second property (for example a second wavelength) thereby transforming the laser 204 into an altered laser 205. The altered laser 205 is then received at the detector 212, which interprets the altered laser 205 as the information stored earlier in the target cell 206. In various embodiments, one or more of the other storage cells 210 may also alter the laser 204, thereby contributing to the alterations of the altered laser 205 that is detected at the detector 212.

In some embodiments, the information detected at the detector 212 may include different complexities of information based on the properties of the target cell 206. For example as described in earlier figures, the properties of the target cell 206 may include electrical information including charge location and intensity within the target cell 206. Such information about the amount of charge accumulated can be determined by measuring the dot product and noting the intensity, in some embodiments. Additional methods of reading the electrical properties of the target cell 206 may include using a lower power/lower intensity laser that sweeps the polarization vector from 0 to Pi radians. Such examples and methods are understood to be non-limiting, and alternate embodiments may use other methods for reading the electrical information stored in the target cell 206. As a result, information beyond binary states can be recorded within the three dimensional storage device 208.

It is understood that FIGS. 1 through 7 work in conjunction with each other, and that for clarity of illustration certain elements of FIGS. 1 through 7 are not pictured in all of the figures (e.g. the detector 212). In various embodiments, the emitter 102 and the emitter 202 may be the same emitter or different emitters. For example, a single emitter may be used to emit the higher power laser used in the write functions described with respect to FIG. 1. The same single emitter may also be used to emit the lower power laser used in the read functions described with respect to FIG. 2. In further embodiments, the emitter 102 used to write information may be separate from the emitter 202 used to read information.

Figure 8:
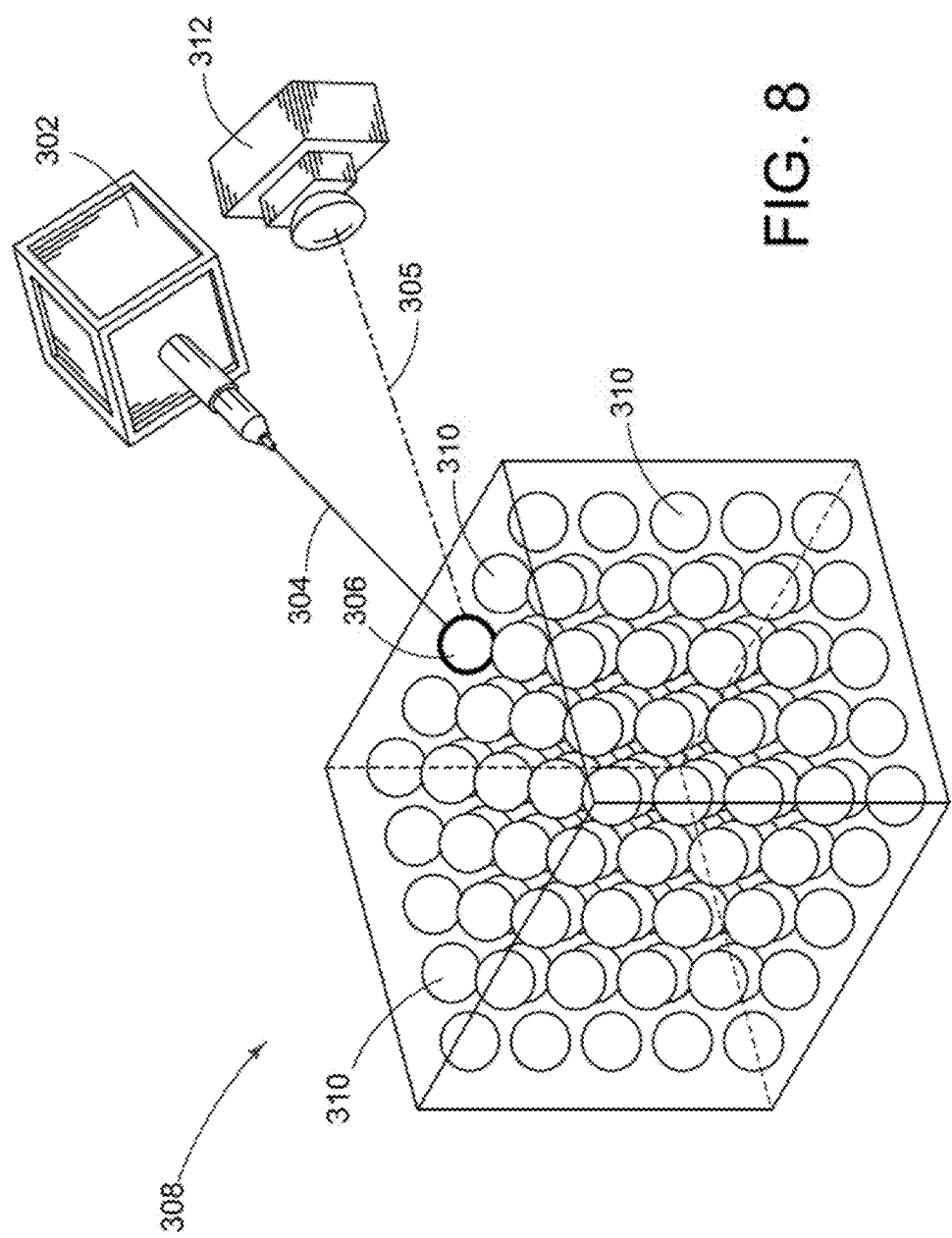
FIG. 8 shows a target cell of a three dimensional storage device reflecting and altering a laser from an emitter, and a detector detecting the altered laser according to one aspect of the present embodiments.

Referring now to FIG. 8, a target cell 306 of a three dimensional storage device 308 reflecting and altering a laser 304 from an emitter 302, and a detector 312 detecting the altered laser 305 is shown according to one aspect of the present embodiments. Similar to FIG. 7, in the embodiment of FIG. 8 the emitter 302 generates a lower power laser 304 than the FIG. 1 laser 104. As such, the lower power laser 304 may be focused on a target cell 306, without altering the properties of the target cell 306.

However, the properties of the target cell 306 may alter and reflect the laser 304 (or a portion of the laser 304), thereby transforming the laser 304 into the altered laser 305. Therefore, the target cell 306 of FIG. 8 differs from the target cell 206 of FIG. 7 by reflecting the laser 305. As a result, the altered laser 305 is a reflected laser that is then detected at the detector 312. Information stored by the target cell 306 may be read through the detection of the altered laser 305. It is understood that in certain configurations the target cell 306 may not alter the properties of the laser 304, and therefore the altered laser 305 may be the same as the laser 304.

For example, information may be stored in one or more of the cells, as described in FIG. 1. The emitter 302 may then generate a laser 304 with a first property (for example a first intensity). The laser 304 is focused on the target cell 306, and travels through other storage cells 310, without being altered. The target cell 306 then changes the first property of the laser 304 into a second property (for example a second intensity) thereby transforming the laser 304 into an altered laser 305. The altered laser 305 is then reflected from the target cell 306 and received at the detector 312. The detector 312 interprets the altered laser 305 as the information stored earlier in the target cell 306. In various embodiments, one or more of the other storage cells 310 may also alter the laser 304, thereby contributing to the alterations of the altered laser 305 that is detected at the detector 312.

It is understood that FIG. 1 and FIG. 8 work in conjunction with each other, and that for clarity of illustration certain elements of FIG. 1 and FIG. 8 are not pictured in both figures (e.g. the detector 312). In various embodiments, the emitter 102 and the emitter 302 may be the same emitter or different emitters. For example, a single emitter may be used to emit the higher power laser used in the write functions described with respect to FIG. 1. The same single emitter may also be used to emit the lower power laser used in the read functions described with respect to FIG. 8. In further embodiments, the emitter 102 used to write information may be separate from the emitter 302 used to read information.

Figure 9:
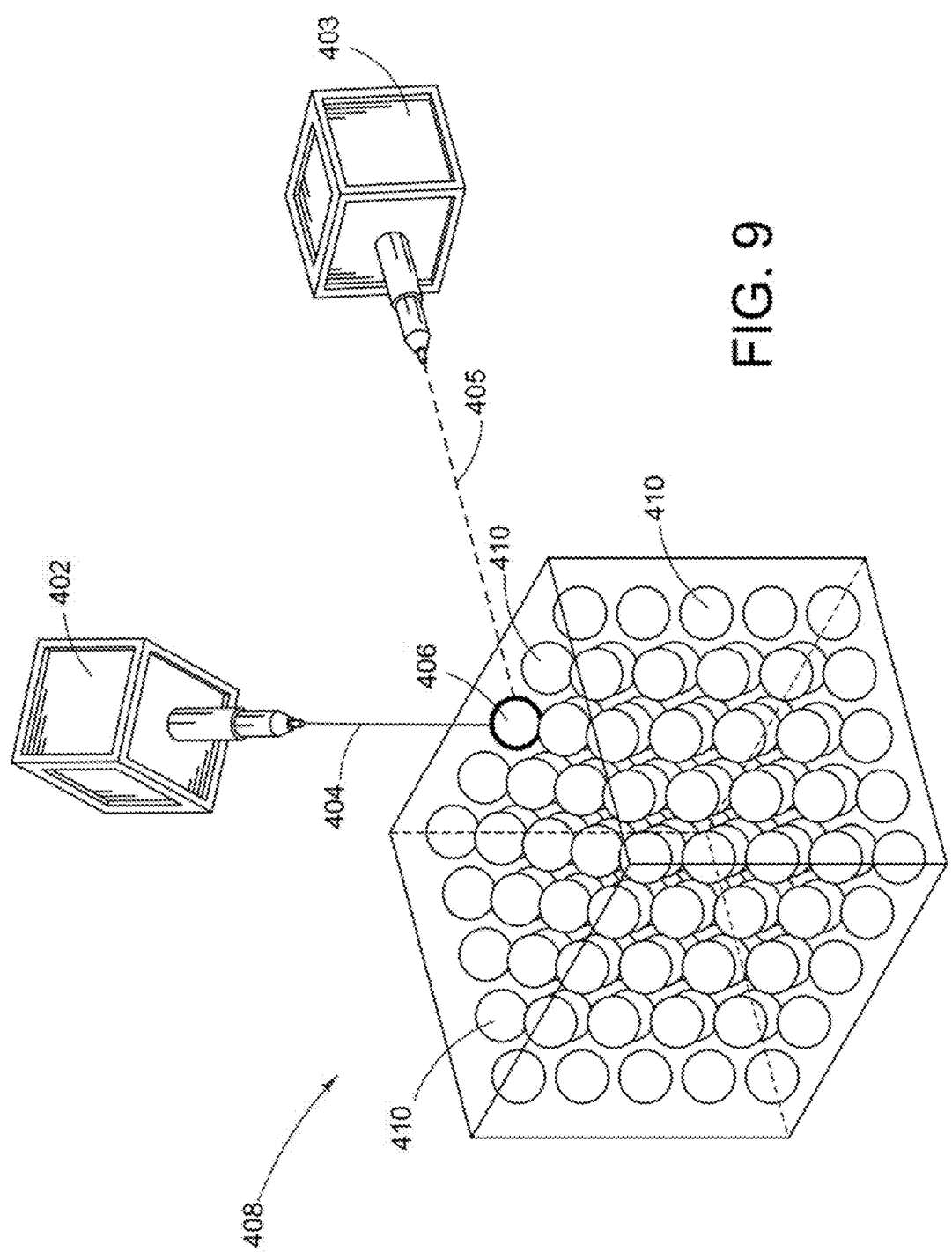
FIG. 9 shows a first emitter and a second emitter focusing a first laser and a second laser on a cell of a three dimensional storage device according to one aspect of the present embodiments.

Referring now to FIG. 9, a first emitter 402 and a second emitter 403 focusing a first laser 404 and a second laser 405 on a cell 406 of a three dimensional storage device 408 are shown according to one aspect of the present embodiments. As in FIG. 1, the first emitter 402 creates a high power first laser 404, and the second emitter 403 creates a low power second laser 405. It is understood that high power and low power are relative to each other. Therefore, the first laser 404 has a higher power than the second laser 405, and the second laser 405 has a lower power than the first laser 404.

The first laser 404 is focused on the target cell 406. The target cell 406 is one of many storage cells 410 arranged within a three dimensional array within the three dimensional storage device 408. When the laser 404 is focused on the target cell 406, the electrical properties of the target cell 406 may be altered (as previously described), thereby storing information.

In addition, the second emitter 403 may be focused on the target cell 406. In various embodiments, the second emitter 403 may create a lower power second laser 405 or a higher power second laser 405. Therefore, the second emitter 403 may be used in conjunction with the first emitter 402 for writing information to the target cell 406. In addition, the second emitter 403 may be used to read information from the target cell 406 before, during, and/or after the first emitter creates the first laser 404. For clarity of illustration, the detector (see FIG. 8) is not shown, however it is understood that one or more detectors may be present in various embodiments.

In further embodiments, different intensities of the first laser 404 (from the first emitter 402) and the second laser 405 (from the second emitter 403) may be combined for reading and/or writing to the target cell 406. For example, the first laser 404 alone and the second laser 405 alone may not have sufficient power to write to the target cell 406. However, the combination of the first laser 404 and the second laser 405 may have sufficient power to write to the target cell 406. Therefore, it is understood that various combinations of laser intensities may be used to read cell electrical properties or change cell electrical properties.

Figure 10:
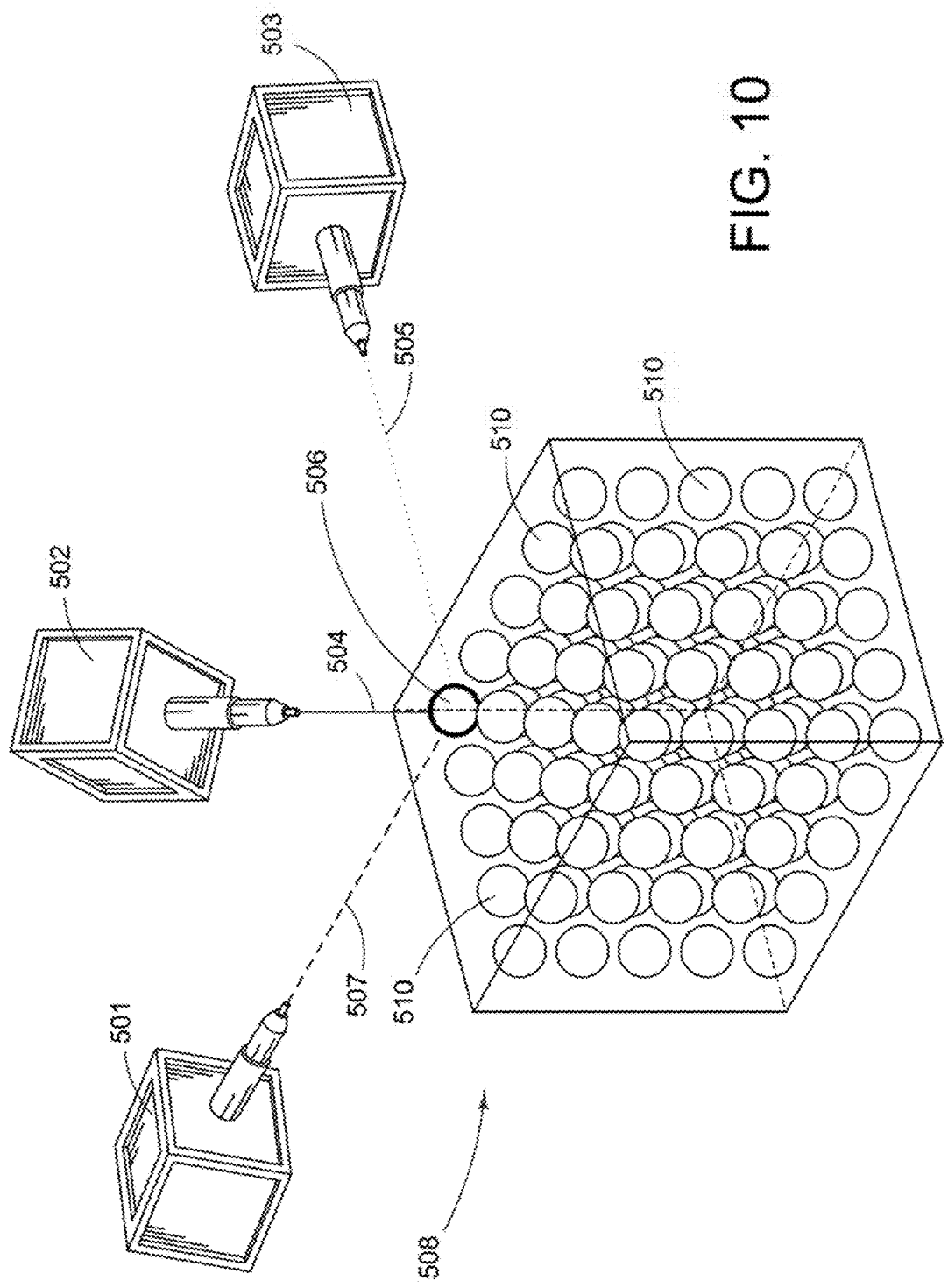
FIG. 10 shows a first emitter, a second emitter, and a third emitter focusing a first laser, a second laser, and a third laser on a cell of a three dimensional storage device according to one aspect of the present embodiments.

Referring now to FIG. 10, a first emitter 502, a second emitter 503, and a third emitter 501 focusing a first laser 504, a second laser 505, and a third laser 507 on a cell 506 of a three dimensional storage device 508 are shown according to one aspect of the present embodiments. As in FIG. 1, the first emitter 502 creates a higher power first laser 504. The first laser 504 is focused on the target cell 506. The target cell 506 is one of many storage cells 510 arranged within a three dimensional array within the three dimensional storage device 508. When the laser 504 is focused on the target cell 506, the electrical properties of the target cell 506 may be altered (as previously described), thereby storing information.

In addition, the second emitter 503 and the third emitter 501 may be focused on the target cell 506. In various embodiments, the second emitter 503 creates a lower power second laser 505 or a higher power second laser 505, and the third emitter 501 creates a lower power third laser 507 or a higher power third laser 507. It is understood that any combination of differently powered lasers may be used. For example, a high power laser, a medium power laser, and a low power laser may be used by any of the three emitters. In a further example, a high power laser and two low power lasers may be used by any of the three emitters. In still further examples, different power combinations may be produced by any of the emitters.

Therefore for example, the second emitter 503 and/or the third emitter 501 may be used in conjunction with the first emitter 502 for writing information to the target cell 506. In addition, the second emitter 503 and/or the third emitter 501 may be used to read information from the target cell 506 before, during, and/or after the first emitter creates the first laser 504. For clarity of illustration, the detector (see FIG. 8) is not shown, however it is understood that one or more detectors may be present in various embodiments.

In further embodiments, different intensities of the first laser 504 from the first emitter 502, the second laser 505 from the second emitter 503, and/or the third laser 507 from the third emitter 501 may be combined for reading and/or writing to the target cell 506. For example, the first laser 504 alone, the second laser 505 alone, and/or the third laser 507 alone may not have sufficient power to write to the target cell 506. However, the combination of the first laser 504, the second laser 505, and/or the third laser 507 may have sufficient power to write to the target cell 506. In a still further example, different lasers or combinations of lasers may change and/or read different properties (e.g. reflectivity, transparency, refractivity, etc.) of the cell. The different properties may be changed or read simultaneously or at different times. Therefore, it is understood that various combinations of laser intensities may be used to read cell properties or change cell properties.

Figure 11:
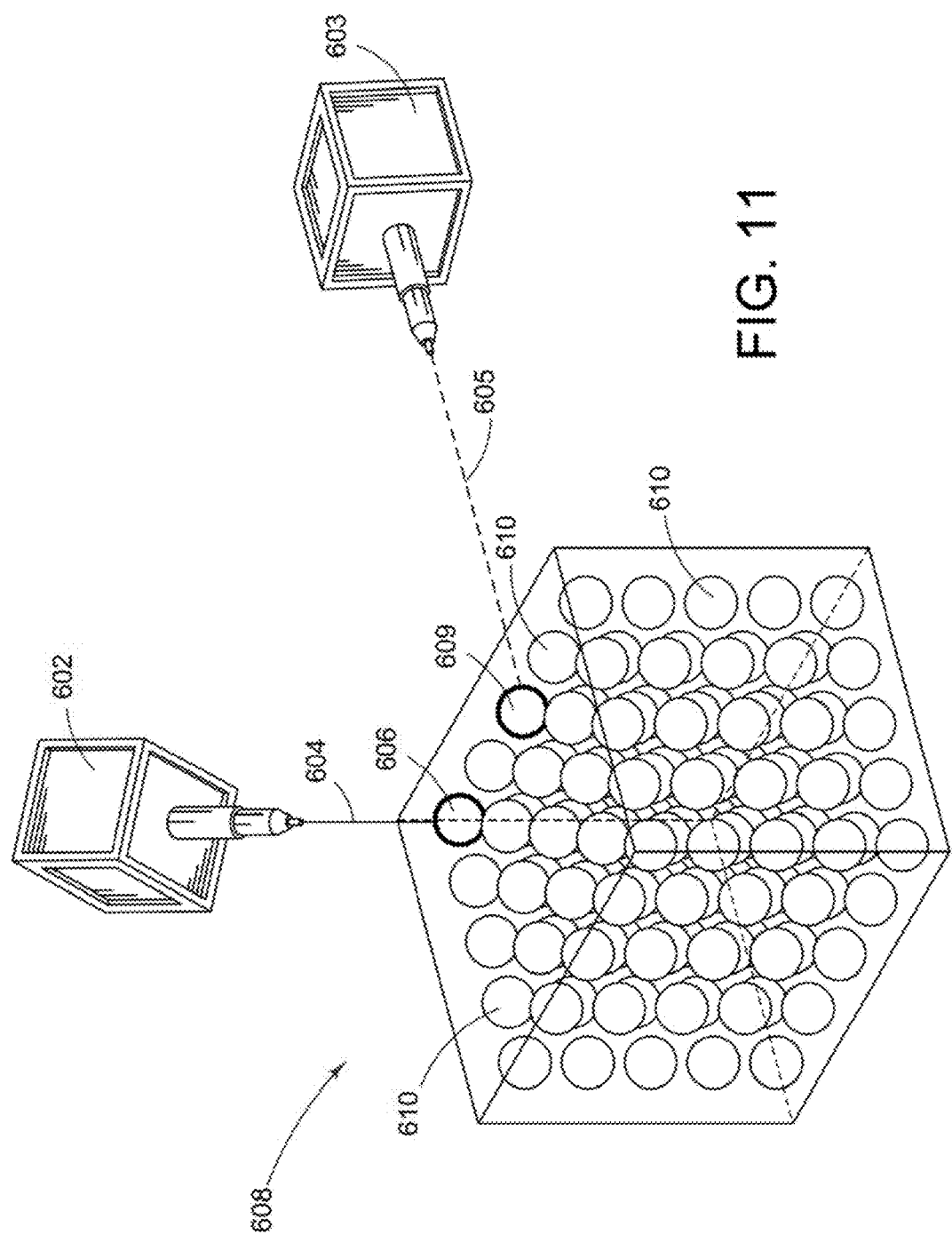
FIG. 11 shows a first emitter focusing a first laser on a first cell, and a second emitter focusing a second laser on a second cell of a three dimensional storage device according to one aspect of the present embodiments.

Referring now to FIG. 11, a first emitter 602 focusing a first laser 604 on a first cell 606, and a second emitter 603 focusing a second laser 605 on a second cell 609 of a three dimensional storage device 608 are shown according to one aspect of the present embodiments. As in previous figures, the first emitter 602 may perform read/write operations on the first target cell 606 by radiating a higher power or lower power first laser 604. The first laser 604 is focused on the first target cell 606. The first target cell 606 is one of many storage cells 610 arranged within a three dimensional array within the three dimensional storage device 608. When the laser 604 is focused on the target cell 606, properties of the target cell 606 may be altered or read (as previously described). It is understood that the first emitter 602 may perform the read/write functions by itself or in conjunction with one or more additional emitters.

In addition, the second emitter 603 may be focused on the second target cell 609. The second emitter 603 may perform read/write operations on the second target cell 609 by radiating a higher power or lower power second laser 605. The second laser 605 is focused on the second target cell 609. The second target cell 609 is one of many storage cells 610 arranged within the three dimensional array within the three dimensional storage device 608. When the second laser 605 is focused on the second target cell 609, properties of the second target cell 609 may be altered or read (as previously described). It is understood that the second emitter 603 may perform the read/write functions by itself or in conjunction with one or more additional emitters.

In various embodiments, the first emitter 602 and the second emitter 603 may perform read functions or write functions at the same time or at different times. In some embodiments, different read functions and different writing functions may be performed simultaneously by the first emitter 602 and the second emitter 603. For example, the first emitter 602 may be detecting or creating a first electron density of the first target cell 606, and the second emitter 603 may be detecting or creating a second electron density of the second target cell 609 that is different from the first electron density. For clarity of illustration, one or more detectors (see FIG. 8) are not shown, however it is understood that one or more detectors may be present in numerous combinations with the emitters in various embodiments.

Figure 12B:
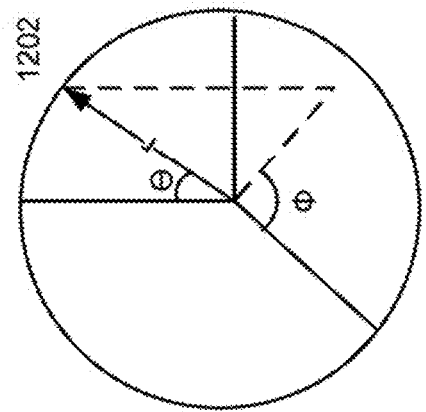
FIGS. 12A-12C show orientation and intensity representation of electric field information stored in a three dimensional storage device according to one aspect of the present embodiments.
Figure 12C:
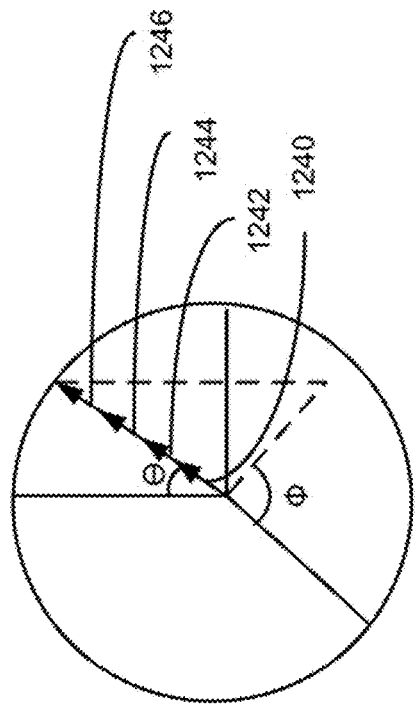
Figure 12A:
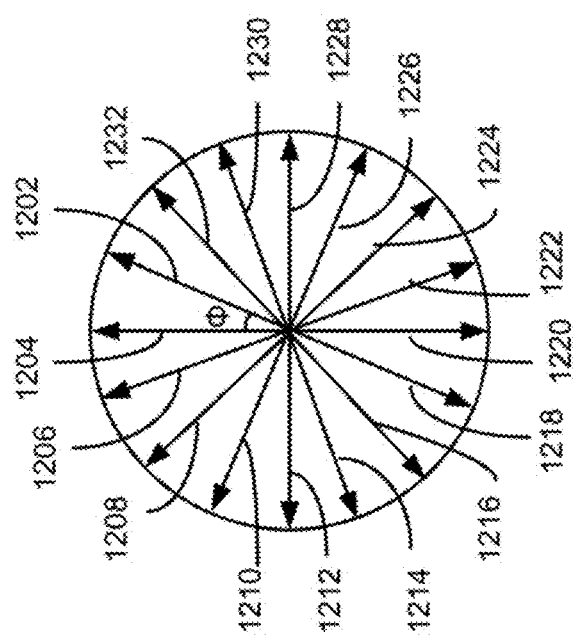

Referring now to FIGS. 12A-12C, orientation and intensity representation of electric field information stored in a three dimensional storage device according to one aspect of the present embodiments is shown. As presented above, when a three dimensional storage device cell is excited, e.g., elevating its energy for instance by applying a laser beam to the cell or using excitation circuitry or shockwave generator as described in subsequent figures, electrical charges within the cell may be oriented and the intensity of the electric field in the cell may be adjusted. Once in the excited state, the electrical charges within the cell may be oriented, as desired. For example, the electrical charges within the cell may be oriented to have a particular orientation angle defined by ($\theta$, $\varphi$), where $\theta$ is the angle of the electric field with respect to the horizontal plane and where $\varphi$ is the angle of the electric field with respect to the vertical plane. It is appreciated that the orientation may be changed, for example, by altering the dipoles, as discussed with respect to FIGS. 1-11. It is appreciated that the intensity of the electric field may also be adjusted in addition to its orientation. The intensity may be defined by r.

In other words, the electrical charges within a cell of the three dimensional storage medium may be oriented to have a particular ($\theta$, $\varphi$) and a particular intensity r. Accordingly, rather than storing binary information, as it is done by conventional storage medium, storage capacity by one cell can greatly be expanded. For example, there are 360° angle for each $\theta$ and $\varphi$. In addition, the intensity may be adjusted. As such, one cell can expand the storage capacity by more than a hundred times if not by thousands of times the conventional binary storage medium. For example, for the same intensity electric field, if the orientation angles are allowed to be adjusted by 1° angle increment for 360° for each $\theta$ and $\varphi$, the capacity of the cell is increased by 360×360 which is 129,600 times. In the same example, if the intensity can be varied to have a binary possibility the capacity can be increased by $129,600^2$ which is $1.67962e^{10}$ times. In the same example, if the intensity of the electric field can be varied to have three possible intensity values, then the capacity can be increased by $129,600^3$ which is $2.17678e^{15}$ times. In another example, for the same intensity electric field, if the orientation angles are allowed to be adjusted by 36° angle increment for 360° for each $\theta$ and $\varphi$, the capacity of the cell is increased by 10×10 which is 100 times. In the same example, if the intensity can be varied to have a binary possibility the capacity can be increased by $100^2$ which is 10,000 times. In the same example, if the intensity of the electric field can be varied to have three possible intensity values, then the capacity can be increased by $100^3$ which is 1,000,000 times. It is appreciated that the exemplary numbers provided are for illustrative purposes and not intended to limit the scope of the embodiments.

Referring now to FIG. 12A, an illustrative embodiment where only the $\varphi$ angle can be changed is shown. For example, the electric field intensities 1202-1232 are the same. However, the $\varphi$ angle can be varied. In this illustrative embodiment, the $\varphi$ angle increments are 22.5°. Since there are $\varphi$ angle can rotate 360°, then there are 16 possible values. In other words, the storage capacity of a cell having the same electric field intensity and having the same $\theta$ angle can be increased by 16 folds by varying the 100 angle at 22.5° increments.

Referring now to FIG. 12B, an electric field representation 1202 having an intensity r and orientation angles ($\theta$, $\varphi$) is shown. Referring now to FIG. 12C, varying the intensity of the electric field for the same ($\theta$, $\varphi$) orientation is shown. For example, electric field 1240 has a lower intensity in comparison to the electric field 1242 which has a lower intensity in comparison to the electric field 1244 which has a lower intensity in comparison to the electric field 1246. As illustrated in FIGS. 12A-C, the storage capacity of a single cell can be greatly increased by varying the electric field intensity and its orientation in comparison the conventional binary storage medium.

Figure 13B:
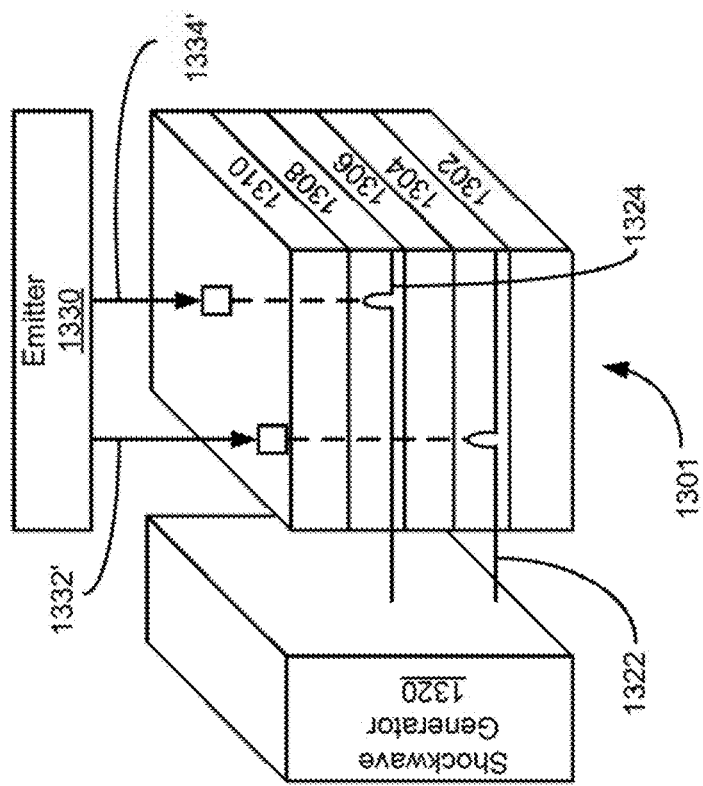
FIG. 13A-13B show storing electric field information in a three dimensional storage device using a shockwave generator according to one aspect of the present embodiments.
Figure 13A:
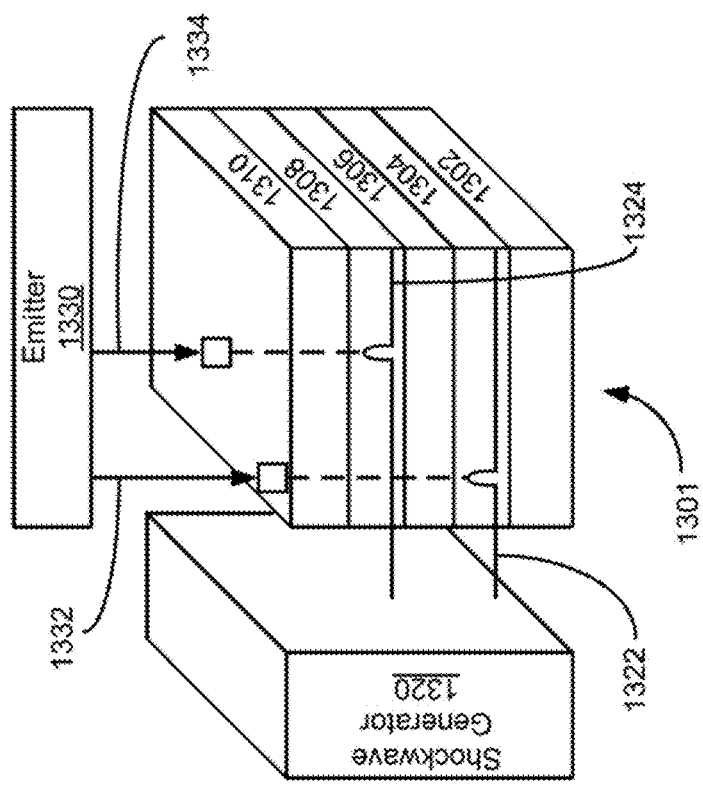

Referring now to FIG. 13A-13B, storing electric field information in a three dimensional storage device using a shockwave generator according to one aspect of the present embodiments is shown. Referring specifically to FIG. 13A, a three dimensional storage device 1301, a shockwave generator 1320, and an emitter 1330 is shown. The shockwave generator 1320 excites one or more layers of the three dimensional storage device 1301. Each layer of the three dimensional storage device 1301 may include a plurality of cells. During the excitation period the emitter 1330 may shine an optical array, e.g., laser beam, onto a particular cell (hereinafter referred to as a target cell or cell to be written to) within the excited layer of the storage device 1301 in order to orient electrical charges within the target cell, e.g., change the orientation angles ($\theta$, $\varphi$). It is appreciated that the intensity of the electric field may also be changed by varying the power of the optical array for each target cell. Once the excitation period is terminated, the target cell maintains the oriented electrical charges and the intensity. As such, information can be maintained and stored within the target cell.

The three dimensional storage device 1301 may include multiple layers 1302, 1304, 1306, 1308, and 1310. It is appreciated that any number of layers may be present and discussion of a five layer storage device is for illustrative purposes only and should not be construed as limiting the scope of the embodiments. The three dimensional storage device 1301 may comprise material where its optical characteristics, e.g., refractive index, reflection index, etc., can change when excited. For example, the storage device 1301 may comprise transparent material such as quartz glass. In some embodiments, the storage device 1301 may comprise polymer material where the electrical properties can be altered in response to energy excitation of the storage device 1301. In some embodiments, the storage device 1301 may include a photoactive cube that is optically transparent such as polystyrene doped with ferroelectric material. In some embodiments, the polystyrene that is doped may have a fixed or varying polarization.

The shockwave generator 1320 may be a megasonic transducer that generates a pressure wave (p-wave) signal that changes the characteristics of a particular layer of the three dimensional storage device 1301 during the excitation period. In some embodiments, the shockwave generator 1320 may generate acoustic waves that change the characteristics of a particular layer of the three dimensional storage device 1301 during the excitation period. For example, the shockwave generator 1320 may generate a p-wave signal or acoustic waves 1322 and 1324 in layers 1304 and 1308 of the three dimensional storage device 1301 respectively. The p-wave effect or acoustic waves may change the characteristics of the layers, e.g., optical index such as refractive index, reflective index, etc. during the excitation period. In other words, the material density and/or the index of the layer that is being excited changes during the excitation period. It is appreciated that in some embodiments, the shockwave generator may induce a p-wave using a rapid thermal shock, e.g., by using a pulsed laser, mechanical piezo transducer appropriately positions at each layer, etc. It is appreciated that the excitation period is the period during which the characteristics of the layer is changed.

According to some embodiments, as the p-wave or acoustic signals 1322 and 1324 travel through their respective layers 1304 and 1308, the emitter 1330 shines optical signals 1332 and 1334, e.g., laser signal, onto a desired target cell to orient the target cell's electrical charges. It is appreciated that in some embodiments, the emitter 1330 may be a laser emitter, e.g., a femtosecond laser. It is also appreciated that the emitter 1330 works synchronously with the shockwave generator 1320 such that the signals 1332 and 1334 arrive at the target cells within the respective layers 1304 and 1308 at the same time that the p-wave or acoustic signals 1322 and 1324 arrive. In other words, the electrical charges, e.g., dipole orientation, within the target cell can be oriented during the excitation period which is when the p-wave or acoustic signal is present. In some embodiments, the electrical charges within a target cell may be oriented as desired as long as the p-wave signal or acoustic signal are present at the same time as the beam from the emitter 1330. For example, as the p-wave signal or acoustic signal 1322 arrives at a target cell of interest, the emitter 1330 shines an optical beam 1332 in order to orient the electrical charges of the target cell, e.g., by rearranging and reorienting the dipoles within the target cell. Similarly, as the p-wave signal or acoustic signal 1324 arrives at a target cell of interest, the emitter 1330 shines an optical beam 1334 in order to orient the electrical charges of the target cell, e.g., by rearranging and reorienting the dipoles within the target cell.

It is appreciated that in some embodiments, the intensity of the electric field within each target cell may also be controlled via the power intensity delivered through the emitted beam, e.g., beam 1332 or beam 1334. In other words, the intensity of the electric field within the target cell may be increased by delivering a higher power beam and it may be decreased by delivering a lower power beam. It is appreciated that once the p-wave or acoustic signal 1322 departs from the target cell, the target cell maintains the oriented electric field and the intensity of the electric field because the excitation period is terminated. For example, the characteristics of the layer, e.g., optical index such as refractive index, reflective index, etc. may return to their original values as the p-wave or acoustic signals 1322 or 1324 departs from the targeted cell or layer. The return of the characteristics of the targeted cell to their original values enables the targeted cell to maintain the orientation of the electric field and the intensity of the electric field in absence of the excitation period, e.g., in absence of p-wave signal or acoustic signal.

It is further appreciated that multiple target cells and multiple layers of the three dimensional storage device 1301 may be written to at the same time, e.g., as shown in FIG. 13A two target cells in two different layers. However, it is appreciated that the number of target cells and layers being written to, as discussed, is for illustrative purposes only and should not be construed as limiting the scope of the embodiments.

Referring now to FIG. 13B, an embodiment similar to the one shown in FIG. 13A is shown that is chronologically later in time. For example, FIG. 13B shows the p-wave or acoustic signals 1322 and 1324 later in time as they propagate through their respective layers 1304 and 1308. At a later in time, subsequent beams, e.g., 1332' and 1334', may be emitted to other target cells further down the propagation path of the p-wave or acoustic signals 1322 and 1324. As such, the electrical charges within the other target cells further down the propagation path of the p-wave or acoustic signals 1322 and 1324 may be oriented based on the beams 1332' and 1334', similar to the embodiment discussed in FIG. 13A. Similarly, the intensity of the electric fields within the target cells may be controlled through varying the power of the beams 1332' and 1334' emitted through the emitter 1330, similar to FIG. 13A. As discussed above, the target cells maintain the electric field orientation and their intensity once the p-wave or acoustic signal 1322 and 1324 leave the target cells. As such, electric field orientation and intensity may be stored in respective target cells. As described with respect to FIGS. 12A-C, orienting the electric field and intensity with a target cell may substantially increase the storage capacity of the cell.

Figure 14:
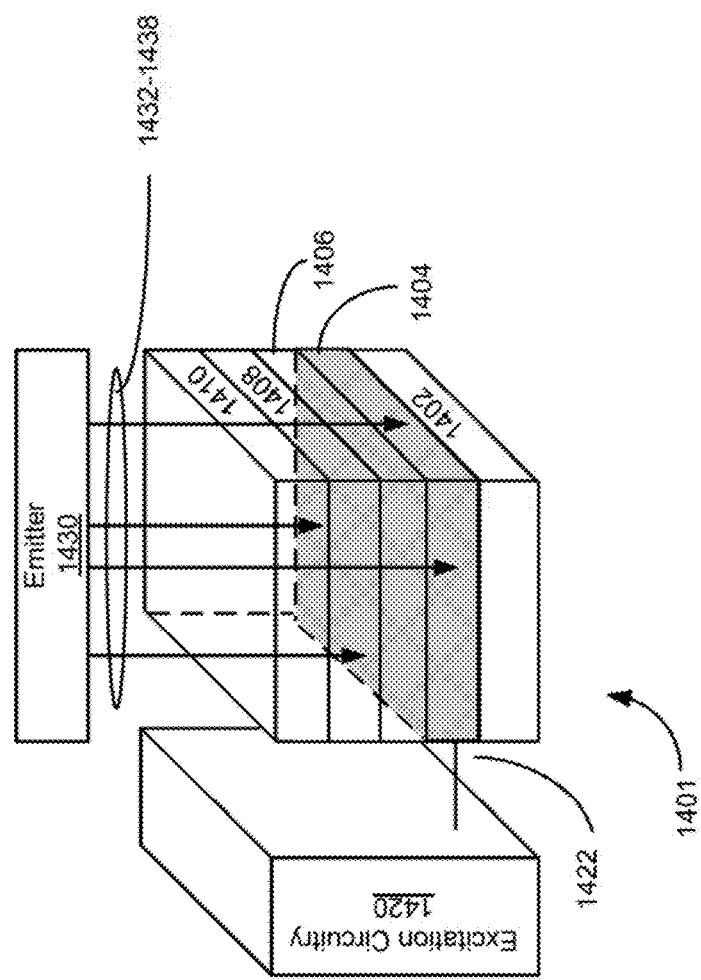
FIG. 14 shows storing electric field information in a three dimensional storage device using excitation circuitry according to one aspect of the present embodiments.

Referring now to FIG. 14, storing electric field information in a three dimensional storage device using excitation circuitry according to one aspect of the present embodiments is shown. FIG. 14 is similar to that of FIGS. 13A-B, as described above. However, in this embodiment, the shockwave generator 1320 is replaced with an excitation circuitry 1420. It is appreciated that the three dimensional storage device 1401 is substantially similar to that of 1301 and functions in similar fashion. The emitter 1430 is substantially similar to that of 1330 and functions in similar fashion.

The excitation circuitry 1420 may be a circuitry that applies an alternative current (AC) voltage, or a radio frequency signal up to an optical frequency of the three dimensional storage device 1401, etc. The excitation circuitry 1420 excites the entire layer, e.g., layer 1404, through excitation signal 1422. During the excitation period, the emitter 1430 may emit one or more beams, e.g., beams 1432-1438, either simultaneously or chronologically or any combination thereof, to the target cells of interest. During the excitation period, as described above, the electrical charges within each target cell may be oriented based on their respective beam received from the emitter 1430. Furthermore, as described above, the intensity of the electric field within each target cell may be controlled through the power intensity of the emitted beam from the emitter 1430. It is appreciated that once the excitation period is over, the target cells maintain the electric field orientation and intensity, thereby substantially increasing the storage capacity of the storage cells in comparison to the conventional binary systems.

It is appreciated that the embodiments should not be construed as limited to one layer being excited and written to at the time, as shown in FIG. 14. For example, one portion of one layer may be excited and written to simultaneously as another portion of another layer being excited and written to. In some embodiments, multiple layers may be excited at the same time and written to simultaneously. In some embodiments, each layer may be excited and written to independent from other layers of the storage cell.

Figure 15A:
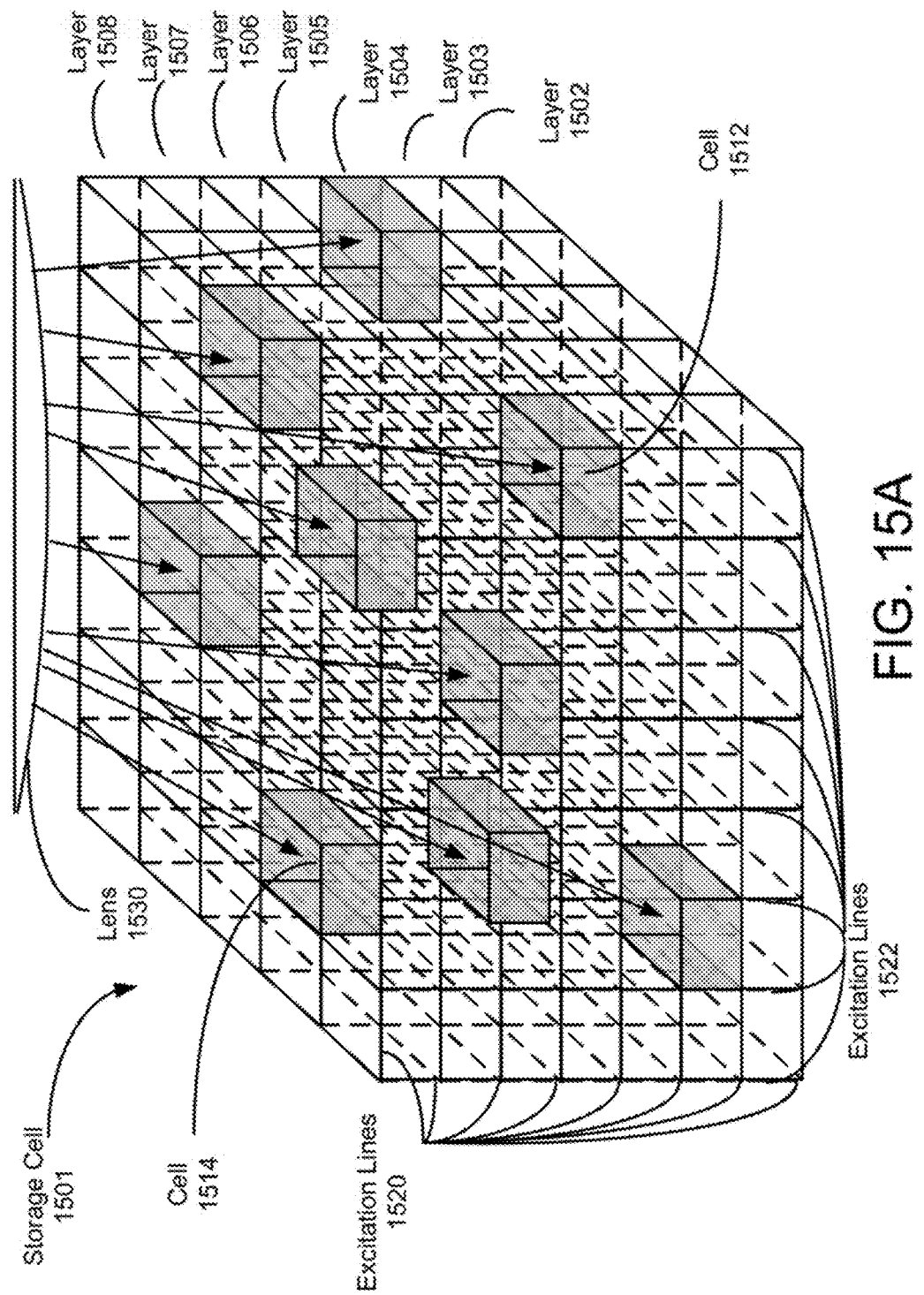
FIGS. 15A-B show storing electric field information in a three dimensional storage device with gridlines to activate cells independently according to one aspect of the present embodiments.
Figure 15B:
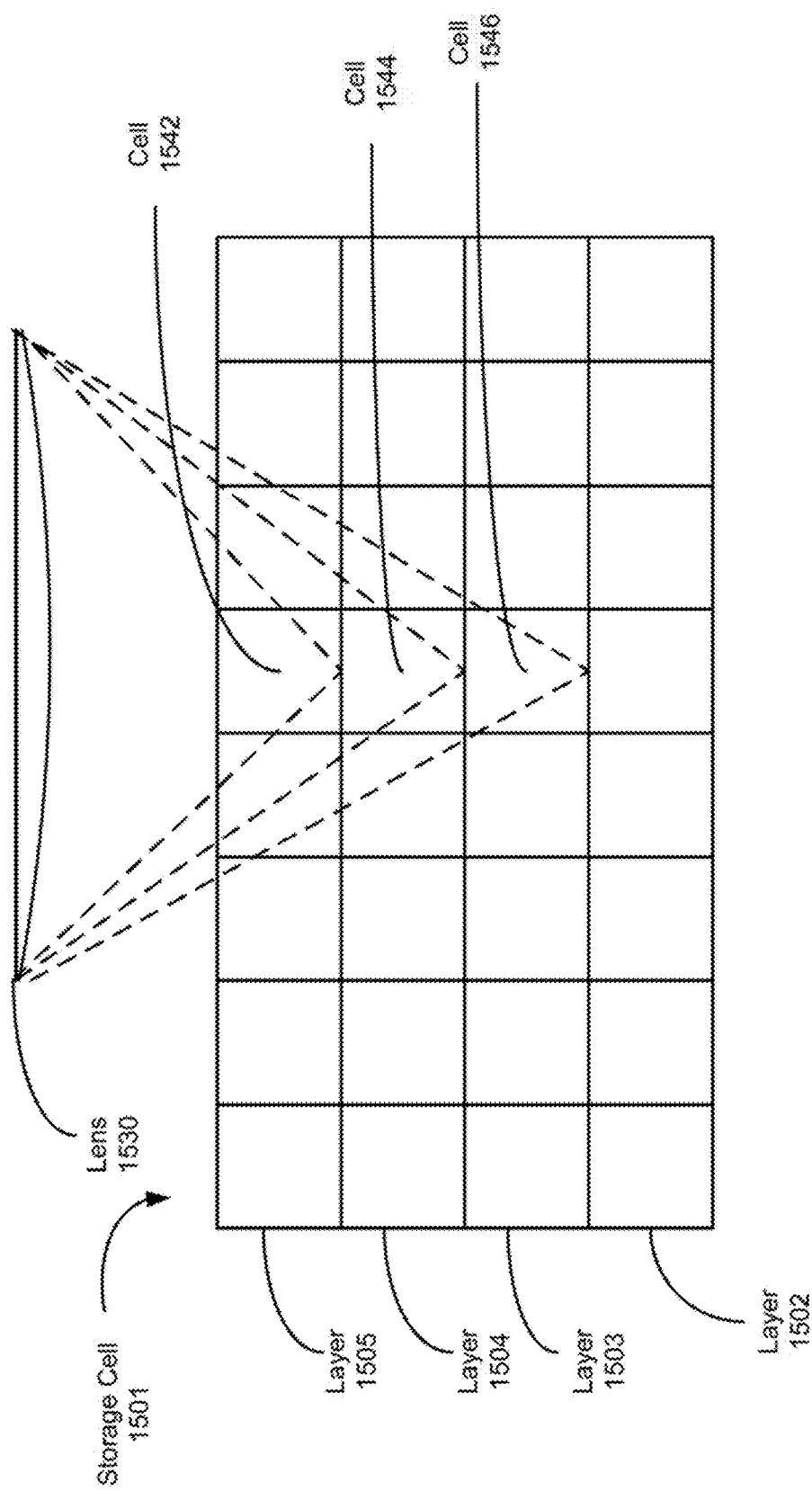

Referring now to FIGS. 15A-B, storing electric field information in a three dimensional storage device with gridlines to activate cells independently according to one aspect of the present embodiments is shown. Referring more specifically to FIG. 15A, a storage device 1501 similar to those described in FIGS. 13A-B and 14 is shown. The storage device 1501 may include layers 1502, 1503, 1504, 1505, 1506, 1507, and 1508, and cells therein, e.g., cells 1512, 1514, etc.

It is appreciated that the storage device 1501 may include horizontal excitation lines 1520 and vertical excitation lines 1522 that are configured to control excitation of each cell individually and independently from one another. In the illustrative embodiment of FIG. 15 the excited target cells are greyed out. For example, cell 1512 may be excited using the vertical and horizontal excitation lines independently from cell 1514. As such, both cells may be written to sequentially or simultaneously. The excitation of individual cells through excitation lines 1520 and 1522 may be through similar means as the one described in FIG. 14.

In some embodiments, once a target cell is excited, e.g., cell 1512, the lens 1530 may direct emitted beams from an emitter (not shown here) to the target cell 1512. The lens 1530 may be graphene ultrathin lens. As such, the lens 1530 may be configured to control emission of the beam to the appropriate layer within the storage device 1501 and the appropriate target cell. It is appreciated that the lens 1530 may be coupled to the emitter (not shown) or it may be coupled to the top layer of the storage device 1501, e.g., layer 1508. It is appreciated that in some embodiments, the lens 1530 may be integrated within the upper layer of each cell individually due to the lens being a graphene ultrathin lens.

In some embodiments, the electrical charges within the target cell 1512 may be oriented appropriately when the target cell 1512 is excited. Moreover, the intensity of the electric field within the target cell 1512 may be varied when the target cell 1512 is excited by varying the power of the beam. It is appreciated that the beam going through the lens 1530 may be generated using any of the emitters discussed above and it may be a femtosecond laser beam. It is appreciated that discussed above, once the target cell 1512 is no longer excited, the orientation of the electric field and the intensity is maintained by the target cell 1512, therefore substantially increasing the storage capacity of the cell in comparison the conventional binary systems.

Referring now to FIG. 15B, a side view of the embodiment described in FIG. 15A is shown. As shown, the lens 1530 may be configured and control the direction of the emitted beam to the appropriate layer of the storage device 1501, e.g., layer 1503, 1504, or 1505, and the appropriate target cell, e.g., cell 1542, 1544, or 1546.

It is appreciated that FIGS. 13A-15B describe storing electrical information in various target cells within excited cells or layers. However, it is appreciated that reading/retrieving the stored electrical information from the cells may be substantially similar to that described in FIGS. 1-11. In other words, a lower power, e.g., lower power than the excitation energy, may be applied such that electrical information, e.g., electric field orientation and intensity within the cell, is not altered but read.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:
1. An system comprising:
a data storage medium comprising a plurality of layers, wherein each layer comprises a plurality of cells that are arranged in a horizontal plane of the data storage medium with respect to one another, and wherein cells in different layers of the plurality of layers are arranged in a vertical plane of the data storage medium with respect to one another, and wherein each cell is configured to store electric field information;
an excitation circuit configured to excite a layer of the plurality of layers during excitation period, wherein exciting the layer of the plurality of layers changes an optical property of the layer during the excitation period; and
an emitter configured to emit a beam onto a cell of the layer being excited during the excitation period to store the electric field information thereto, and wherein the beam being emitted onto the cell of the layer being excited during the excitation period changes electrical characteristics of the cell of the layer being excited during the excitation period, wherein the cell of the layer being excited maintains the changed electrical characteristics after the excitation period is over or in absence of the layer of the plurality of layers being excited, and wherein the changed electrical characteristics maintained by the cell of the layer being excited are the electric field information to be stored onto the data storage medium, and wherein the change to the optical property includes a refractive changes and reflective changes, and wherein the optical property associated with the cell of the layer being excited changes to its original optical property after the exci- tation period is over and maintains the oriented electric field information within the layer being excited.

2. The system as described in claim 1, wherein the data storage medium comprises transparent material.

3. The system as described in claim 1, wherein the emitter is a femtosecond laser and wherein the beam is laser.

4. The system as described in claim 1, wherein the excitation circuit is configured to apply an alternating current (AC) voltage to the layer of the plurality of layers during the excitation period.

5. The system as described in claim 1, wherein the excitation circuit is configured to apply a radio frequency (RF) up to an optical frequency of the layer to excite the layer of the plurality of layers during the excitation period.

6. The system as described in claim 1, wherein the electric field information comprises orientation of an electric field.

7. The system as described in claim 1, wherein the electric field information comprises intensity of an electric field, wherein the intensity is controlled by a power of the beam emitted by the emitter.

8. The system as described in claim 1, wherein a value of the electric field information has at least three possible values.

9. An system comprising:
a data storage medium comprising a plurality of layers, wherein each layer comprises a plurality of cells that are arranged in a horizontal plane of the data storage medium with respect to one another, and wherein cells in different layers of the plurality of layers are arranged in a vertical plane of the data storage medium with respect to one another;
an excitation circuit configured to excite a layer of the plurality of layers during excitation period, wherein exciting the layer of the plurality of layers changes an optical property of the layer during the excitation period; and
an emitter configured to emit a first beam onto a first cell of the layer being excited during the excitation period to orient electrical charges within the first cell to a first oriented value and their intensity to a first intensity value, and wherein the emitter is further configured to emit a second beam onto a second cell of the layer being excited during the excitation period to orient electrical charges within the second cell to a second oriented value and their intensity to a second intensity value, wherein the first cell maintains the first oriented value and the first intensity value after the excitation period is over or in absence of the layer being excited and wherein the second cell maintains the second oriented value and the second intensity value after the excitation period is over or in absence of the layer being excited, and wherein the change to the optical property includes a refractive changes and reflective changes, and wherein the optical property associated with the layer being excited changes to its original optical property after the excitation period is over.

10. The system as described in claim 9, wherein the data storage medium comprises transparent material.

11. The system as described in claim 9, wherein the emitter is a femtosecond laser and wherein the first beam is laser.

12. The system as described in claim 9, wherein the excitation circuit is configured to apply an alternating current (AC) voltage to the layer of the plurality of layers during the excitation period.

13. The system as described in claim 9, wherein the excitation circuit is configured to apply a radio frequency (RF) up to an optical frequency of the layer to excite the layer of the plurality of layers during the excitation period.

14. The system as described in claim 9, wherein the first oriented value is different from the second oriented value and wherein the first intensity value is different from the second intensity value, and wherein the first beam and the second beam are emitted simultaneously to the first cell and the second cell during the excitation period.

15. The system as described in claim 9, wherein the first oriented value has at least three possible values and the first intensity value has at least three possible values.

16. An system comprising:
a data storage medium comprising a plurality of layers, wherein each layer comprises a plurality of cells that are arranged in a horizontal plane of the data storage medium with respect to one another, and wherein cells in different layers of the plurality of layers are arranged in a vertical plane of the data storage medium with respect to one another;
an excitation circuit configured to excite a first layer of the plurality of layers during a first excitation period and a second layer of the plurality of layers during a second excitation period, wherein the excitation circuit is configured to excite different layers of the plurality of layers independent from one another, wherein exciting the first layer and the second layer changes an optical property of the first layer and the second layer during excitation periods associated therewith; and
an emitter configured to emit a first beam onto a first cell of the first layer being excited during the first excitation period to orient electrical charges of the first cell to a first oriented value and their intensity to a first intensity value, and wherein the emitter is further configured to emit a second beam onto a second cell of the second layer being excited during the second excitation period to orient electrical charges of the second cell to a second oriented value and their intensity to a second intensity value, wherein the first cell maintains the first oriented value and the first intensity value after the first excitation period is over or in absence of the first layer being excited and wherein the second cell maintains the second oriented value and the second intensity value after the second excitation period is over or in absence of the second layer being excited.

17. The system as described in claim 16, wherein the data storage medium comprises transparent material.

18. The system as described in claim 16, wherein the emitter is a femtosecond laser and wherein the first beam is laser, and wherein the first intensity value is controlled by a power of the first beam.

19. The system as described in claim 16, wherein the excitation circuit is configured to apply an alternating current (AC) voltage to the first layer of the plurality of layers during the first excitation period and to the second layer of the plurality of layers during the second excitation period.

20. The system as described in claim 16, wherein the excitation circuit is configured to apply a radio frequency (RF) up to an optical frequency of the first layer of the plurality of layers during the first excitation period and to the second layer of the plurality of layers during the second excitation period.

21. The system as described in claim 16, wherein the change to the optical property includes a refractive changes and reflective changes during excitation periods, and wherein the optical property associated with the first and the second layer change to their original optical property after the after associated excitation periods is over.

22. The system as described in claim 16, wherein the first the excitation period and the second excitation period share a same start time and an end time.

23. The system as described in claim 16, wherein the first oriented value is different from the second oriented value, and wherein the first intensity value is different from the second intensity value.

24. The system as described in claim 16, wherein at least one of a start time, end time, and duration associated with the first excitation period and the second excitation period is different.

* * * * *